United States Patent [19]

Bergstrom et al.

[11] Patent Number: 5,307,379
[45] Date of Patent: Apr. 26, 1994

[54] AUTOMATIC NOISE CHARACTERIZATION FOR OPTIMALLY ENABLING A RECEIVER

[75] Inventors: Chad S. Bergstrom, Chandler; F. Elvin Krasin, Phoenix; Sue E. Sprute, Chandler, all of Ariz.

[73] Assignee: Motorola, Inc., Schaumburg, Ill.

[21] Appl. No.: 874,318

[22] Filed: Apr. 27, 1992

[51] Int. Cl.$^5$ ............................................. H03K 17/30
[52] U.S. Cl. ........................................ 375/76; 307/360
[58] Field of Search ................. 375/76; 307/359, 360, 307/361, 362, 351, 356

[56] References Cited

U.S. PATENT DOCUMENTS

| | | | |
|---|---|---|---|
| 3,214,700 | 10/1965 | Hook | 307/360 X |
| 3,437,834 | 4/1969 | Schwartz | 307/360 |
| 3,602,825 | 8/1971 | Senior | 307/360 X |
| 4,262,264 | 4/1981 | Vandergraaf | 331/4 |
| 4,358,738 | 11/1982 | Kahn | 307/356 X |
| 4,480,236 | 10/1984 | Harris | 333/174 |
| 4,529,892 | 7/1985 | Reilly et al. | 307/360 X |
| 4,942,589 | 7/1990 | Smith et al. | 375/1 |
| 4,956,644 | 9/1990 | Leahy et al. | 342/351 |

Primary Examiner—Curtis Kuntz
Assistant Examiner—Paul Loomis
Attorney, Agent, or Firm—Frederick M. Fliegel; Robert M. Handy

[57] ABSTRACT

A multi-channel receiver automatically determines the noise floor of each channel and resets the channel threshold based thereon while avoiding undesirable bias from weak non-noise signals. The power probability of uncharacterized input signals (non-noise content unknown) is computed and normalized to have a known probability that the power exceeds a first threshold. A second probability of exceeding a second threshold is determined and compared to a predetermined reference probability for a noise-only signal at the same threshold. If the computed second probability is not higher than the reference probability, then the uncharacterized signal is a noise only signal whose average is the noise floor for the channel. The threshold detection level is then set a predetermined amount above the noise floor. The process is automatic and compensates for receiver aging and ambient noise fluctuations with time and from channel to channel and for other changes.

18 Claims, 7 Drawing Sheets

AUTOMATIC NOISE CHARACTERIZATION FOR OPTIMALLY ENABLING A RECEIVER

FIELD OF THE INVENTION

The present invention concerns an improved means and method for distinguishing pure noise and non-pure noise input signals so as to better enable a signal receiver.

BACKGROUND OF THE INVENTION

There is a great need in communication and other electronic systems for obtaining maximum sensitivity to information signals in the presence of noise. As used herein, the word "noise" is intended to refer to random electrical signals and the word "non-noise" is intended to refer to signals which are not random noise. Nonlimiting examples of noise signals are Gaussian noise signals. Nonlimiting examples of non-noise signals are coherent signals, carrier signals and modulated signals.

It is common in the electronic art, particularly the communication art to provide a detection threshold gate at the apparatus input to prevent noise signals from triggering false alarms in the apparatus. Often the threshold is adjusted according to the needs of the user, sometimes being set to a low level (i.e., close to the ambient noise level) when great sensitivity is desired and at other times being set to a higher level (i.e., substantially above the ambient noise level) when blanking a strong source is more important than great sensitivity.

In some communication systems where maximum sensitivity is desired, the threshold is set close to the ambient noise level. That is, the ambient noise level is determined and the threshold level (i.e., the level at which the input gate opens to admit a received signal) is set above the ambient noise level by a small pre-determined amount. This ambient noise level is referred to in the art as the "noise floor". When the amplitude of the input signal exceeds the noise floor by the predetermined amount, the gate "opens" admitting the incoming signal to the receiver (i.e., "enabling" the receiver), and when the input signal is less than the predetermined amount, the gate "closes" thereby blocking the input signal from the receiver. The foregoing arrangement for muting receivers is well known in the art.

Despite the widespread use of detection threshold systems in the prior art, several problems remain:

First, in many instances, manual real time adjustment of the threshold level is not possible. In these situations, individual threshold levels are generally preset at conservative levels and thereafter remains unchanged. One of the difficulties with this approach is that it does not take into account aging of the receiver components or changes in supply voltage or other time dependent effects which may cause the signal appearing at the input signal detector to vary in amplitude. While the receiver may still be capable of amplifying these input signals to useful levels, they now fall below the preset fixed detection threshold and are no longer admitted to the receiver. Thus, as the receiver ages, the detector no longer admits such signals and they are lost. Conversely, a drop in the detection threshold due to receiver aging or a rise in the background noise level will trigger the detector, leading to false alarms, i.e., false signal detection.

Second, the threshold level cannot be set to optimally enable the receiver unless the ambient noise floor is known with some precision. Unfortunately, the noise floor is not constant but varies with time. Unless a means is available for conveniently measuring the noise floor and recalibrating the system, the threshold level must be set sufficiently high so that even under the worst anticipated noise conditions, the probability of false alarm is still acceptable. This results in much more conservative threshold settings than is desired.

Figure 1:
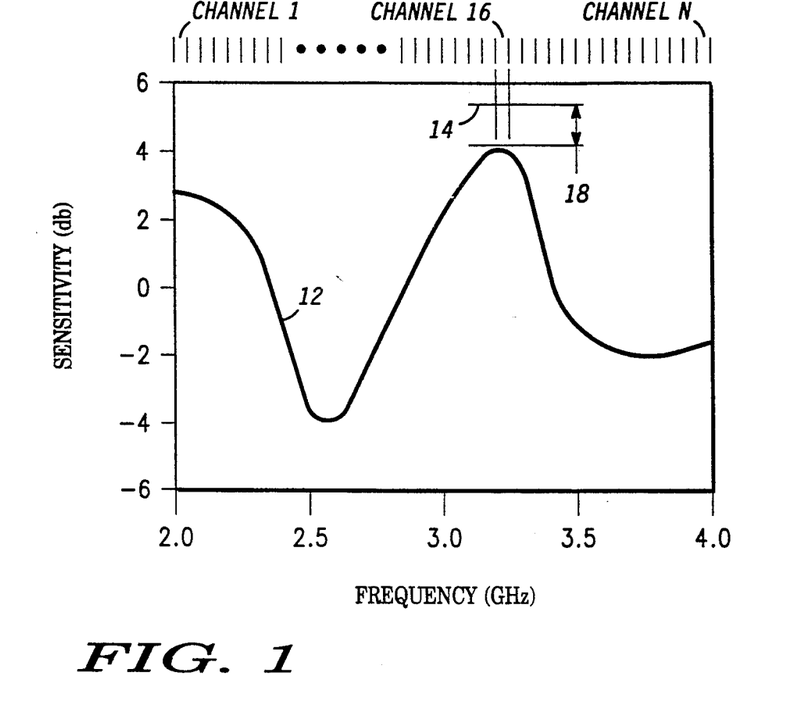
FIG. 1 shows an example of the variation in receiver sensitivity or noise floor per channel as a function of channel frequency in a multichannel receiver.

Third, in multichannel receivers, the individual channels usually have variations in front-end receiver sensitivity, especially in receivers built to operate at very high frequencies and wide bandwidths. This is illustrated in FIG. 1 wherein undulating curve 12 shows the variation in receiver sensitivity (e.g., input gain) across channels 1-N of a multichannel receiver operating, for example, in the 2.0-4.0 GHz range. Curve 12 also depicts the channel-to-channel variation in the noise floor presented to the detector or receiver. As a consequence of such input sensitivity (or noise floor) variations, the signal levels presented to the threshold detection circuitry vary from channel to channel.

In the prior art it has been customary to assign one fixed noise floor threshold, e.g., line 14 in FIG. 1, for each of the channels irrespective of any input sensitivity (or noise floor) variations over time. Detection threshold 14 exceeds the largest anticipated noise signal from channel 16 by some predetermined amount 18. Noise margin 18 is chosen to provide a predetermined false alarm rate for noise triggering of the channel 16 detector. A result of this prior art approach is that while detection threshold 14 and margin 18 are initially appropriate, the optimum threshold level will change because of receiver aging and changes in the ambient noise levels, so that after a time, the detection threshold is no longer optimum.

Thus, there is an ongoing need to dynamically adjust the detection threshold of receiver channels automatically so as to take into account, for example, aging of receiver input components, and/or channel-to-channel sensitivity and noise floor variations in multichannel receivers with time from channel to channel.

As used herein the word "gain" is intended to include attenuation, the word "receiver" is intended to include any type of apparatus for processing or detecting or measuring or analyzing input signals, the word "signal" or "signals" is intended to include signals of any kind, including but not limited to noise signals, modulated signals, carrier signals and combinations thereof, and the word "uncharacterized" with respect to input signals is intended to refer to signals whose non-noise content is unknown, i.e., which may be either substantially pure noise or noise plus non-noise.

SUMMARY OF THE INVENTION

The present invention provides an improved apparatus and method for controlling admission of arriving signals to an input of a receiver by, dynamically distinguishing between signals having substantially only noise and signals having noise plus some non-noise component, and then using the substantially pure noise signal as the noise floor or reference level for setting the threshold detection level of the receiver. The presence of an input signal that is without a significant non-noise component is determined by taking advantage of differences in the probability distribution between pure noise and noise plus non-noise input signals.

In a preferred embodiment, an uncharacterized input signal (which may be either noise or noise plus non-noise) is normalized so that it has a known first probability that the input exceeds a first predetermined threshold. The normalized input signal is then used to determine a second probability that the input exceeds a second predetermined threshold. This second probability is then compared to a predetermined reference probability that a pure noise signal differs from the same (second) threshold. If the uncharacterized signal contains a non-noise signal component, the computed second probability typically exceeds that expected for a noise-only signal. Thus, noise only signals are distinguished from noise plus non-noise signals and the noise only signal used as the noise floor or reference level in setting the threshold level of a receiver or detector.

In a preferred embodiment, the input signal is first squared before being normalized so that the signal used for determining the probabilities is proportional to the input signal power. Normalization is conveniently accomplished automatically by a feedback loop. In a preferred embodiment, the feedback loop comprises a comparator (for comparing the squared input signal to the first predetermined threshold), a low pass filter (for integrating the comparator output), an adder (for determining the difference between the comparator output and the first reference probability level), an integrator (for integrating the output of the comparator) and a variable gain block (for adjusting the squared input signal amplitude so that the adder output is zero).

The normalized squared input signal is passed through another comparator (for comparing it to the second predetermined threshold), a low pass filter (for integrating the comparator output) and a further comparator (for determining whether the integrated output of the another comparator is the same or different than the second reference probability level).

When the output of the further comparator is substantially the same as the second reference probability level, then a noise-only input signal is present and that input signal level may be used as the noise floor reference level. When it is different, a noise plus non-noise signal is present, and that input signal level should not be used for the noise floor reference level. This indication (i.e., input signal is noise-only or noise plus non-noise) is sent to a processor controlling the receiver input.

Based on the indication from the further comparator that a noise-only signal is present at the receiver input, the processor sets the threshold level of the input gate of the receiver. The threshold level is set to exceed the noise floor by a predetermined amount called the noise margin. The input gate admits signals larger than the threshold amount and blocks signals smaller than the threshold amount.

The present invention is especially useful in connection with multichannel receivers since each channel may be dynamically adjusted, preferably automatically.

DETAILED DESCRIPTION OF THE DRAWINGS

Figure 2:
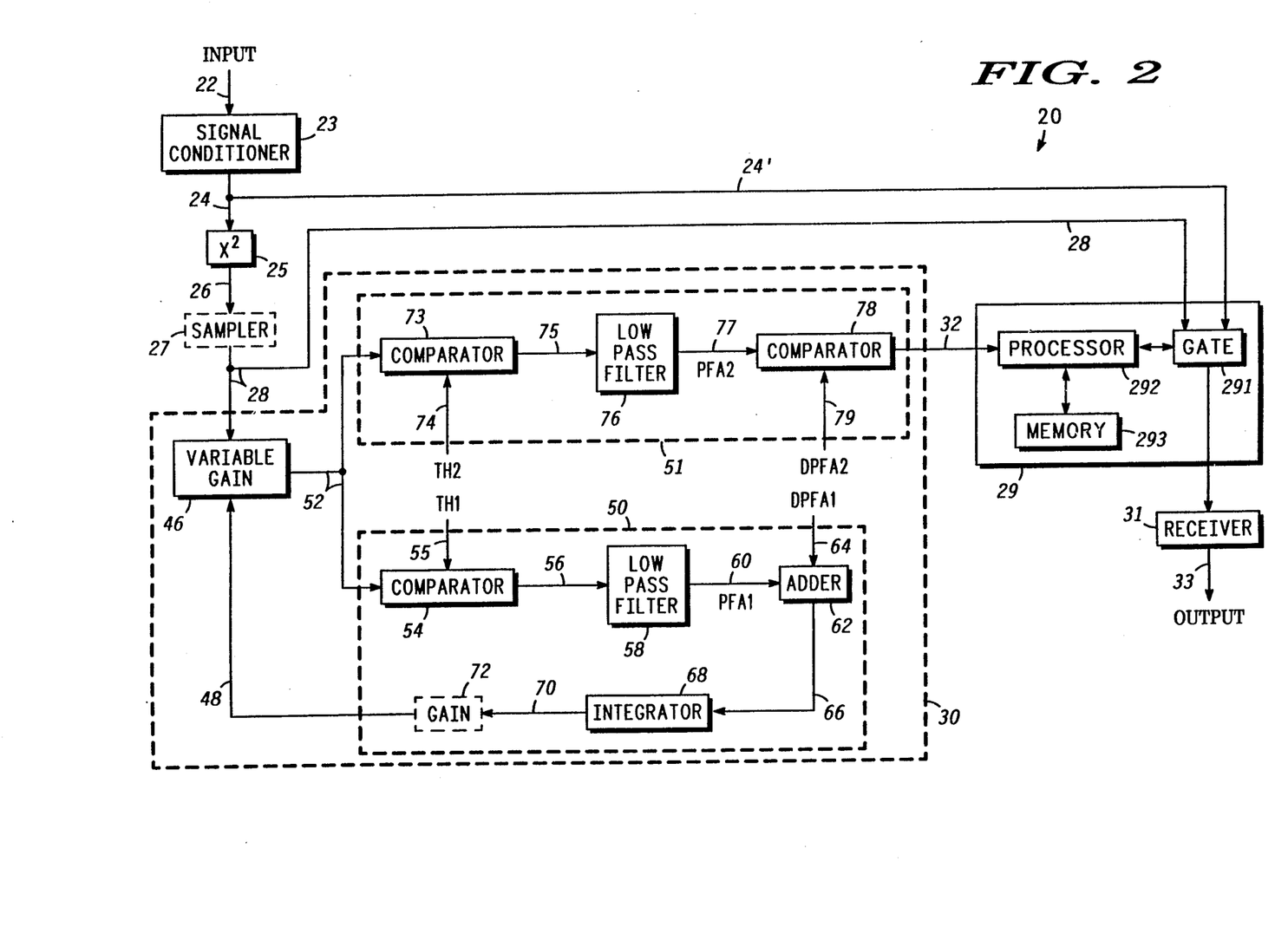
FIG. 2 shows an apparatus for identifying the noise floor and setting the detection threshold of a receiver according to a preferred embodiment of the present invention.
Figure 3:
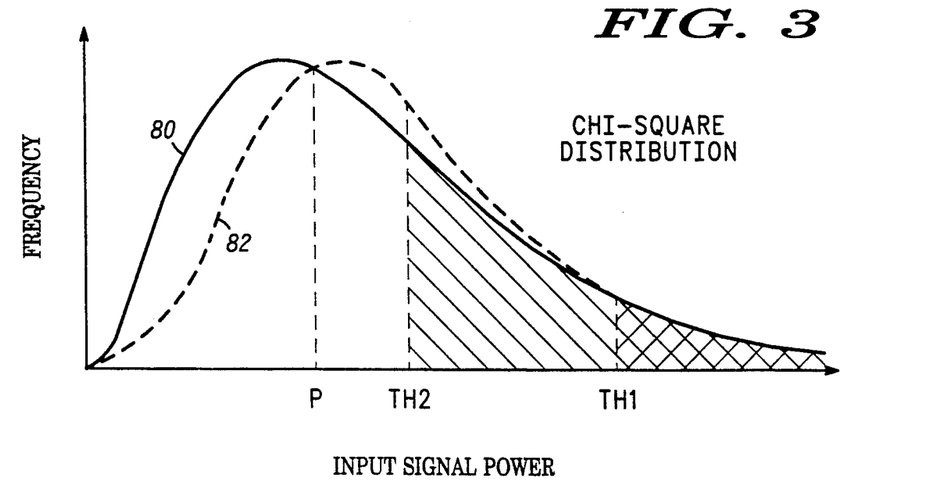
FIG. 3 is a plot of the probability distribution as a function of input signal power for pure noise and noise plus signal conditions.
Figure 4:
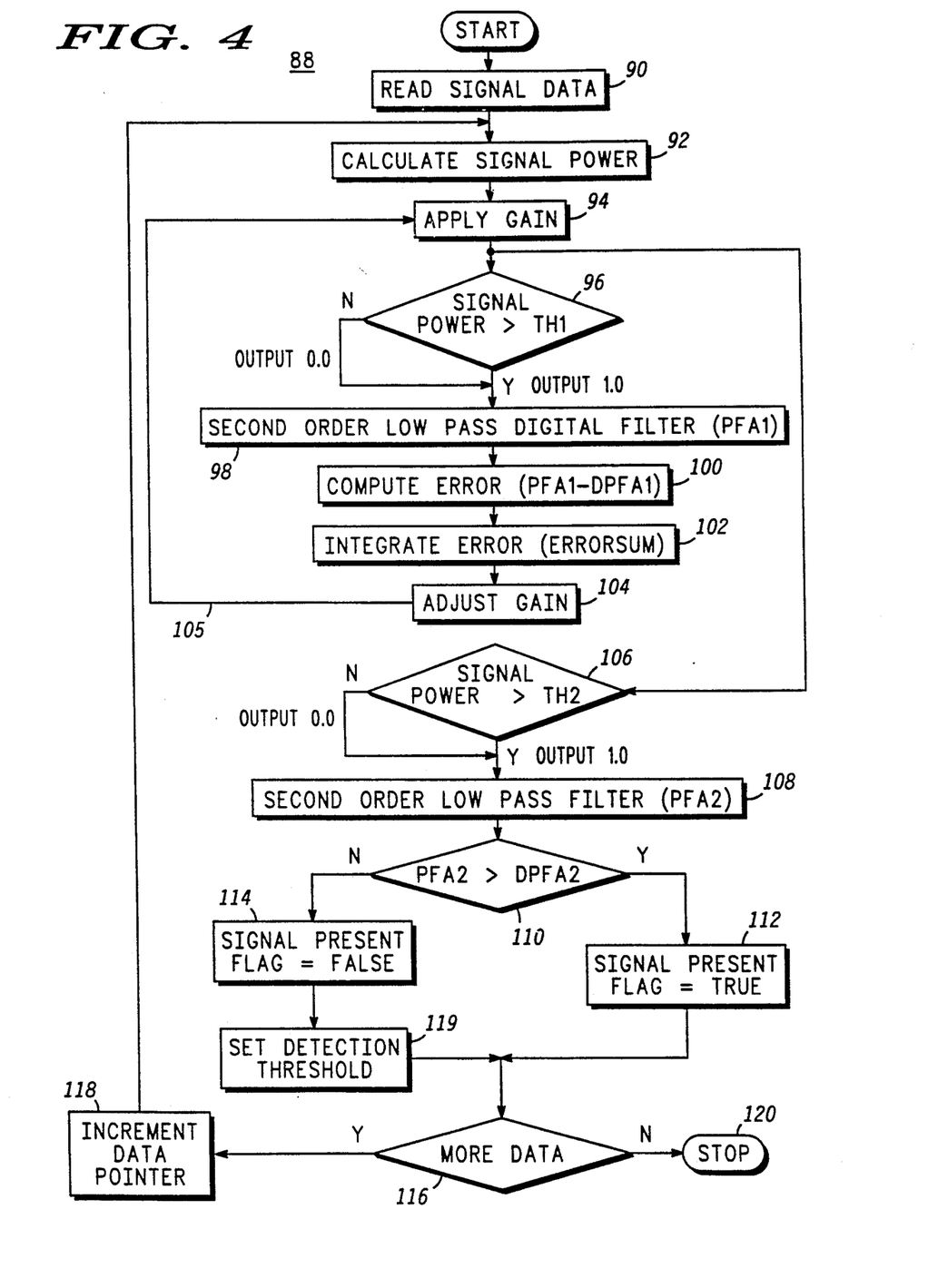
FIG. 4 is a flow chart illustrating the method of the present invention for determining when pure noise is present and setting the detection threshold level of a receiver based thereon.
Figure 5:
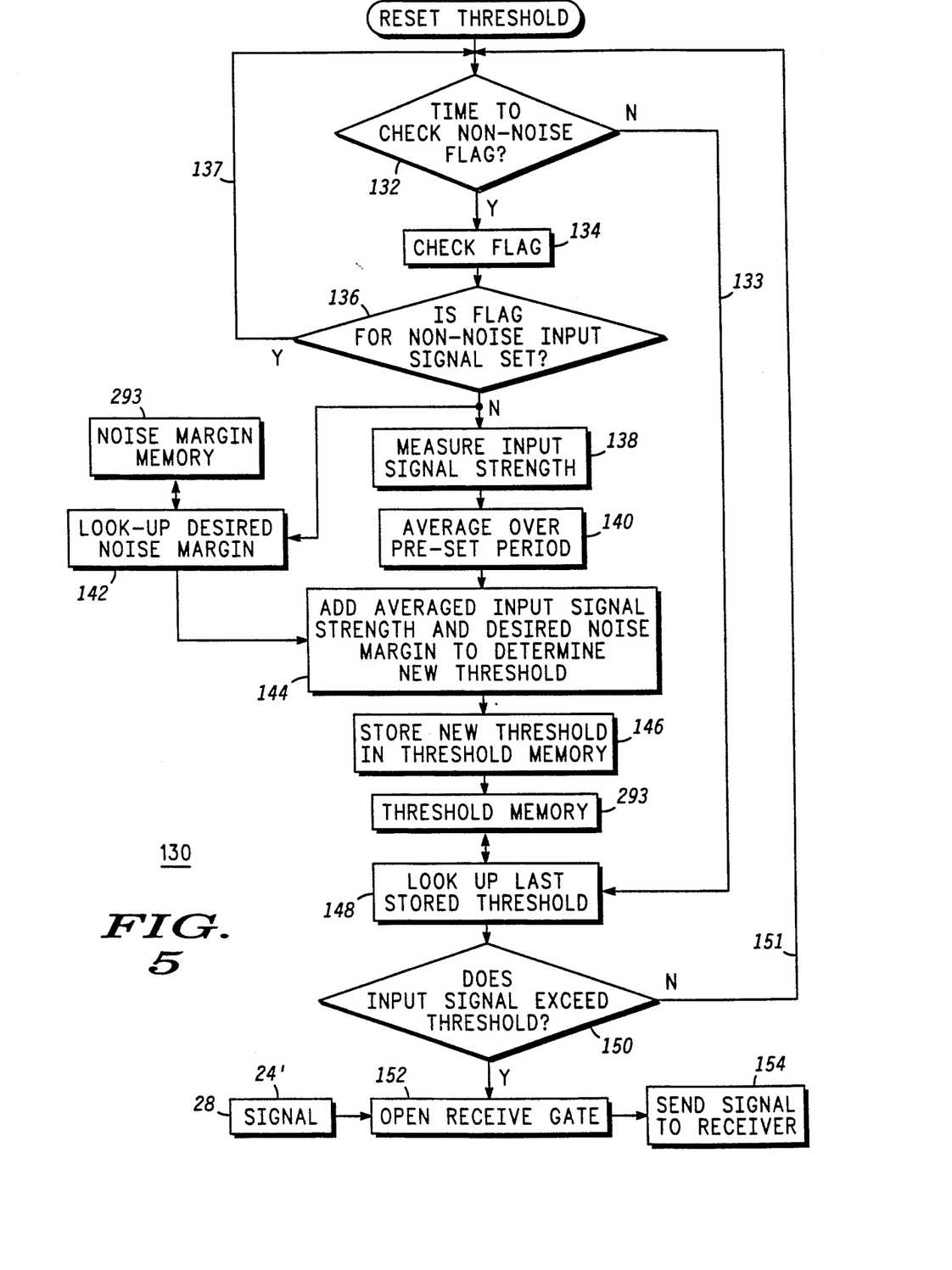
FIG. 5 is a flow chart illustrating the method of the present invention for controlling the response of a receiver based on the noise threshold determined in FIG. 4.

FIG. 2 shows apparatus 20 for measuring the noise floor and setting a threshold level for gating or enabling receiver 31, according to a preferred embodiment of the present invention. FIG. 3 is a plot of a Chi-square or Rayleigh probability distribution (see for example, Cramer, "Elements of Probability Theory, John Wiley and Sons, New York, N.Y., 1955, FIG. 10 and Section 8.1, pages 121-124). FIGS. 4-5 shows flow charts illustrating a preferred embodiment of the method of the present invention carried out, for example, by apparatus 20 of FIG. 2. The present invention will be more fully understood by considering the figures together.

Referring now to FIG. 2, apparatus 20 receives, for example, RF input signal 22 arrives at input signal conditioning circuit 23 which provides amplified or conditioned signal 24. Input signal 22 sometimes contains Pure noise and sometimes contains a mixture of noise and non-noise components. Input circuit 23 is optional and may contain amplifiers and tuning elements depending upon the Particular application and may be a single channel or one of multiple channels depending upon the desired function.

Signal 24 from input circuit 23 is sent to squarer 25 which multiplies signal 24 by itself, that is performs the operation $X^2$. Any square law detector or other device which multiplies an input signal by itself may be used for squarer 25. A diode followed by a low pass filter is a non-limiting example of a suitable square law device. Signal 26 which is output from detector 25 is proportional to the power of input signal 22.

Power signal 26 is passed to optional sampler 27 which samples signal 26 and provides output signal 28 which is still proportional to the power of input signal 22. Where apparatus 20 is implemented using analog techniques, sampler 27 is not needed. Sampler 27 is conveniently used where apparatus 20 is intended to function in a digital fashion and periodically samples incoming signal 24 at a predetermined rate, thereafter performing the indicated functions on each sample.

The order of squarer 25 and sampler 27 may be interchanged, that is, the incoming signal may be sampled and then squared or squared and then sampled, whichever is more convenient in a particular implementation. FIG. 2 illustrates the arrangement in which input 22 is first squared then sampled and flow chart 88 of FIG. 4 illustrates the arrangement in which input 22 is first sampled (block 90) and then squared (block 92). Based on the description herein, those of skill in the art will understand how to implement apparatus 20 in either analog or digital form without undue experimentation. Apparatus 20 represents either a digital or analog implementation while flow chart 88 is most conveniently understood in the context of a digital implementation.

Signal 28 proportional to the power of input signal 22 is sent to receiver processor 29 comprising gate 291, processor 292 and memory 293, and to noise decision apparatus 30, which provides signal 32 to receiver processor 29 indicating whether the incoming signal is substantially pure noise or noise plus non-noise. Processor 292 is conveniently a microprocessor which sets the threshold of gate 291 when signal 32 indicates that the input signal is a noise-only signal, according to instructions stored in memory 293. Those of skill in the art will understand based on the description herein, how to program processor 292 to perform such function.

Depending upon whether gate 291 of receiver processor 29 is open or closed, input signal 28 or 24' is passed to receiver 31. While FIG. 2 shows an arrangement in which input signal 24 passes through squarer 25 before being sent to receiver processor 29, this is not essential and input signal 22 or 24 may be sent to receiver processor 29 without passing through conditioner 23 or squarer 25. FIG. 2 illustrates an arrangement where signal 24' is taken off after passing through conditioner 23 and before squarer 25, but this is merely for convenience of explanation, and signal 24' may be any of signals 22, 24 or 26.

Receiver 31 may be any type of signal processing or measuring or analyzing or detecting or conversion apparatus depending upon the nature of signal 28 (or 24') and the desired result. Receiver 31 provides useful output 33 whose form and nature depends upon the desired system. The details of operation and construction of receiver 31 and nature of output 33 are outside the scope of this invention. The operation of apparatus 30 is illustrated by flow chart 88 of FIG. 4.

Referring now to FIGS. 2 and 4 together, apparatus 30 comprises variable gain adjustment block 46, normalization loop 50 and decision circuit 51. Signal 52 coming out of variable gain block 46 is proportional to signal 28 entering variable gain block 46. The amount of gain provided by variable gain block 46 and therefore the magnitude of signal 52 are determined by feedback loop 50 which adjusts variable gain block 46 so that signal 52 is normalized to predetermined criteria. The gain adjustment operation is illustrated in step 94–104 of flow chart 88 of FIG. 4. The operation of feedback normalization circuit 50 is explained in more detail below.

Output 52 from variable gain block 46 is fed to comparator 54 in feedback circuit 50 wherein it is compared to predetermined reference or "threshold" level TH1 provided at input 55 (step 96 of FIG. 4). While comparator 54 may be either of an analog or digital type, a binary output is convenient. That is, if signal 52 exceeds reference level TH1, then comparator 54 produces a "1" and if output 52 is less than TH1 it produces a "0". Output 56 from comparator 54 is fed to averager 58, e.g., a low pass filter, wherein the comparator output is averaged (step 98 of FIG. 4).

Output 60 from averager 58, identified as "PFA1" is passed to block 62 which functions as an algebraic adder. Predetermined reference level DPFA1 is provided to input 64 of adder 62. Adder 62 computes the algebraic sum PFA1-DPFA1 by subtracting reference level DPFA1 from input PFA1 (step 100 of FIG. 4). The difference between PFA1 and DPFA1 appears at output 66 of adder 62 and is sent to integrator 68 where it is summed (e.g., over the sample interval) to determine an "ERROR SUM" (step 102 of FIG. 4). Integrator 68 may be any integration means well known in the art. For example, and not intended to be limiting, where apparatus 20 is implemented in hardware using dedicated circuitry, a standard integration circuit is suitable, or where apparatus 20 is implemented using a general purpose computer, a standard integration routine is suitable. Output 70 from integrator 68 is fed through optional gain block 72 to control input 48 of gain block 46 (step 104 of FIG. 4, fed back via 105 to step 94) to complete the feedback loop and normalize signal 52. In a preferred embodiment, block 72 provides fixed gain, but this is not essential.

The significance of predetermined reference or threshold levels TH1 and DPFA1 are understood more fully by reference to the FIG. 3. FIG. 3 is a plot of a Chi-square or Rayleigh probability density distribution (also called the "frequency function") where the abscissa is proportional to the input signal power and the ordinate is the probability or frequency that a particular input signal power will be observed. Curve 80 shows the probability density distribution for a pure noise signal and curve 82 for a signal having noise plus non-noise components.

The probability that the power of an input signal is equal to or less than a predetermined power P is given by the area under the probability density curve from the origin to P and the probability that the input signal exceeds the predetermined power level P is the area under the curve from P to infinity. Thus, the hatched area under curve 80 (or 82) to the right of TH1 is a measure of the probability that the signal power exceeds the value TH1. Similarly, the hatched area under curve 80 (or 82) to the right of reference power TH2 is the probability that the signal power exceeds TH2.

Blocks 54 and 58 together compute the area under curve to the right of first reference level TH1. The result, identified as PFA1 (see step 98 of FIG. 4), is then compared to a predetermined first probability reference value DPFA1 and the gain automatically adjusted by feedback loop 50 so that PFA1 equals DPFA1 (steps 90–104 of FIG. 4). DPFA1 is chosen to correspond to the noise power distribution of a pure noise signal for the reference level TH1. PFA1 and DPFA1 are the probability that an input power exceeding TH1 will be observed. In connection with curve 80, this represents the probability of a false alarm if, for example, a receiver threshold were set at TH1.

Those of skill in the art understand how to measure the power distribution of pure noise signals in order to select DPFA1 for any desired value of TH1 or vice-versa. DPFA1 values in the range 0.2 to 0.6 are useful with 0.3 to 0.5 being convenient and about 0.35–0.38 giving good results, but other larger or smaller values can also be used. This process adjusts uncharacterized signal 28, 52 derived from input 22 so that signal 52 from gain block 46 has a magnitude determined by the statistics of a pure noise distribution at power level TH1. This process is referred to as "normalization" of the uncharacterized input signal power, that is, an input signal that may contain either substantially pure noise or noise plus significant non-noise power.

Curve 80 of FIG. 3 shows the probability distribution for a substantially noise-only signal, i.e., substantially pure noise. Curve 82 of FIG. 3 illustrates how the probability distribution changes when noise plus a non-noise signal component are simultaneously present. The normalization process described above forces the input signal probability distribution for noise only (curve 80) and for noise plus non-noise (curve 82) to have the same probability at TH1, i.e., the gain of block 46 is adjusted so that for whatever signal is coming in, PFA1=D-PFA1 at TH1. This normalized signal 52 is then sent to comparator 73 of noise floor detection circuit 51.

Comparator 73 of noise floor detection circuit 51 receives normalized input power signal 52 from gain block 46 and functions in substantially the same manner as comparator 54 except that the second reference level TH2 is different than TH1. Comparator 73 compares normalized input signal 52 to second predetermined noise power reference level TH2. Comparator 73 delivers signal 75 to low pass filter or averager 76. If signal 52 exceeds TH2, signal 75 is a "1", otherwise a "0" (step 106 of FIG. 4). This occurs every time comparator 73 functions, i.e. for every sample for digital implementations or continuously for analog implementations. Low pass filter 76 averages the output of comparator 73, thereby computing a quantity identified as PFA2 which is proportional to the area under curve 80 (or 82) depending on whether non-noise is present) to the right of TH2 in FIG. 3. PFA2 is proportional to the probability that the noise power exceeds the reference value TH2 (step 108 of FIG. 4). PFA2 is delivered to comparator 78 as signal 77 (FIG. 2), where it is compared to a second probability reference value or level DPFA2 provided at input 79.

For a pure noise signal, PFA2 has a value corresponding to the area under curve 80 of FIG. 3 to the right of TH2 and represents the probability of observing an input power exceeding TH2. Reference level DPFA2 is chosen to correspond to a desired probability of a false alarm for a pure noise signal distribution for reference level TH2.

If non-noise is present in the input signal, then the area under the curve changes since the noise plus non-noise signal power has a different probability distribution, as shown for example, by curve 82. Thus, PFA2 for a noise plus non-noise signal is different than for a substantially pure noise signal, computed for TH2. When PFA2 is different than, e.g., greater than DPFA2, this indicates that a non-noise signal is present at the input. The difference between PFA2 and DPFA2 is determined by comparator 78 which receives PFA2 signal 77 from filter 76 and also receives DPFA2 reference level 79

Comparator 78 provides output signal 32. When PFA2 exceeds DPFA2, signal 32 indicates that a non-noise signal is present at receiver processor 29 and that processor 292 should not set the threshold for gate 291 based on input signal 28, 24' then present (boxes 110, 112 of FIG. 4). When PFA2 does not exceed DPFA2, signal 32 indicates that input signal 28, 24' then present at receiver processor 29 is noise only and may be used as the noise floor for that channel, When that occurs, processor 292 desirably sets the detection threshold of gate 291 (boxes 110, 114, 119 of FIG. 4) above the noise floor by whatever noise margin is desired. Thus, signal 32 conveniently has the form of a flag which indicates whether the signal then being input to receiver processor 29 is or is not a substantially pure noise signal. The noise floor value may be stored in memory 293 for future reference. The predetermined noise margins to be used with the noise floor to set the thresholds, and the thresholds themselves, are also conveniently stored in memory 293.

When flag 32 indicates the presence of a substantially pure noise signal, then present input signal 28, 24' is the current noise floor and processor 292 resets the threshold for gate 291 to exceed the value thereof by whatever noise margin is desired. When flag 32 indicates that signal 28, 24' is not substantially pure noise, then processor 292 does not reset the threshold level of gate 291 but either admits or blocks input signal 28, 24' to receiver 31 depending upon whether signal 28, or 24' exceeds or does not exceed the previously established threshold level. Frequently, it is desirable to use a noise floor which is an average over a predetermined time span, depending upon the particular application. This is readily accomplished by processor 292.

FIG. 5 shows flow chart 130 describing the operation of receiver processor 29 in conjunction with noise decision apparatus 30 and receiver 31. Microprocessor 291 conveniently provides a timing function as indicated by decision step 132 to determine whether it is time to check the status of output flag 32 (see FIG. 2). The intervals at which flag 32 is checked are determined by the particular requirements of the user. If it is time to check flag 32, then this is accomplished in step 134, i.e., it is determined using apparatus 30 whether signal 28, 24' present at the input to receiver processor 29 is a noise-only signal or a noise plus non-noise signal As provided in decision step 136, if flag 32 indicates that non-noise is present in the input signal, then the process returns to the start as indicated by line 137. If flag 32 indicates that input signal 28, 24' contains substantially only noise, then the input signal (or signal power) strength, i.e., the noise floor, is measured as indicated in block 138 and desirably but not essentially averaged over a preset period chosen by the user as indicated in step 140, and the desired noise margin is retrieved from memory 293 as indicated in step 142.

The results of steps 138, 140, 142 are fed to step 144 wherein the measured noise floor and desired noise margin are added to obtain a new receiver threshold level. The threshold level is the input signal level at which receiver input gate 291 will open to admit a signal to receiver 31. The new threshold level is conveniently stored in memory 293 in step 146. Those of skill in the art will understand that memory 293 (see FIG. 2) may be used to store different kinds of data and/or instructions, e.g., noise margins, noise floor values, threshold values, instructions for processor 292 and other information.

Output 133 from decision step 132 (i.e., not time to check flag) leads to step 148 in which the last stored threshold value is retrieved from memory 293. In decision step 150, the input signal magnitude is compared to the last stored threshold value. If the input signal is less than the threshold, the process returns to the beginning as indicated by line 151. If the input signal exceeds the threshold, then as indicated by step 152, receiver gate 291 is opened and input signal 28, 24' is sent to receiver 31 as indicated in step 154.

The above-described means and method are very useful because knowledge of the current noise floor in any given frequency band or channel at any given time allows the smallest noise margin consistent with a predetermined false alarm rate to be set. For example, noise margin amount 18 can be set for channel 16 (see FIG. 1) and corresponding amounts for the other channels so that threshold level 14 varies from channel to channel and from time to time as the noise floor or other parameters fluctuate.

By contrast, if only the long term average noise floor or a historical noise floor is known, then a much more conservative noise margin must be adopted so as to avoid an undesirably high false alarm rate as the equipment ages or the noise floor fluctuates or other aspects of the system or the environment change or vary from channel to channel or from time to time.

By performing the analysis illustrated by flow chart 88 of FIGS. 4 and 5 at intervals (either regular or random), a pure noise condition is detected so that the noise floor of each channel is automatically measured and the threshold level of each channel may be automatically adjusted as often as is desired. In this way, the system is dynamically recalibrated so that it always operates at or close to the maximum sensitivity of which it is capable, despite equipment and ambient fluctuations.

No human intervention is required, nor is it necessary to bring the receiver into a test laboratory or apply special test equipment thereto or special signals or other special procedures in order to effect this dynamic recalibration and readjustment of the receiver threshold. Further, the above-described means and method are particularly well suited to multichannel receivers since the threshold of each channel can be set independent of the others. A separate apparatus 20, 30 may be provided for each channel or a single apparatus may be switched from channel to channel or a combination thereof In a preferred embodiment, DPFA2 is usually set high enough so that the non-noise signal must exceed some predetermined amount before a "non-noise signal present" indication is provided at 32. This is easily accomplished by, for example, setting DPFA2 a predetermined amount above the expected value PFA2 for noise only. In effect, DPFA2 is the probability of a false alarm from a pure noise signal. The larger DPFA2, the larger the probability of a false alarm due to a noise burst exceeding TH2. The larger the values of TH2 the smaller the resulting probabilities DPFA2 and PFA2. In a preferred embodiment, good results were obtained with TH2 about equal one-half TH1.

When the operation of the system is being controlled, for example, by a computer processor or controller, the steps indicated by FIG. 4 are desirably repeated, as indicated by steps 116 and 118 and FIG. 5. For example, where the apparatus of FIG. 2 is part of a multichannel system, the sequences indicated by the flow chart of FIGS. 4-5 and described in connection with FIG. 2 are repeated for each channel and the noise floor of each channel measured and the channel detection threshold automatically adjusted independent of the other channels. In this fashion, there is no sacrifice in available channel sensitivity due to receiver component variation and/or noise floor variations. Apparatus 20, 30 thus allows receiver 31 to operate at or near maximum available sensitivity on all channels.

A further advantage of the present invention is that it detects when a substantially noise-only (noise floor) signal is present so that the noise floor can be measured and used to set the channel detection thresholds automatically and dynamically. That is, individual channel thresholds may be continually adjusted to extract the maximum or near maximum available sensitivity from the apparatus and/or each channel at all times, independent of aging or other component degradation or variations in the noise floor from channel to channel or from time to time. This is a significant benefit with unattended systems. Further, apparatus 20, 30 significantly enhances performance by forcing the system to consider only those channels or signal conditions without corrupting non-noise signals, even low level non-noise signals, for determining the noise floor.

EXAMPLE

The above-described system was computer modelled using a standard IBM PC compatible 386SX$^{tm}$ type desk-top personal computer programmed in FORTRAN to execute the flow chart of FIG. 4. Virtually any computer of similar or greater capacity will also serve, including special purpose computer or microcomputers such as for example a Type DSP96002 Digital Signal Processor manufactured by Motorola, Inc., Phoenix, Ariz. Other languages besides FORTRAN, as for example but not limited to PASCAL, C, BASIC, ADA, LISP, etc., can also be used. Well known techniques were employed for computer modeling of the various elements illustrated in FIG. 2 and performing the steps indicated in FIG. 4.

Two-pole low pass filters having a frequency response in the form $A^2/(s^2+Bs+A^2)$ were adopted for elements 58 and 76, where $A=1500$ radians/second and $B=(2)(A)(d)$ with a damping coefficient $d=5$, and s having the customary meaning in the art. The sampling period of sampler 27 was $10^{-5}$ seconds, the feedback gain of block 72 was 0.001 and the reference values used were TH1=1.0, TH2=0.5, DPFA1=0.3679 and DPFA2=0.6065. DPFA1 and DPFA2 indicate the probabilities of false alarms. The other elements shown in FIG. 2 were implemented using computer model equivalents well known in the art.

Figure 6:
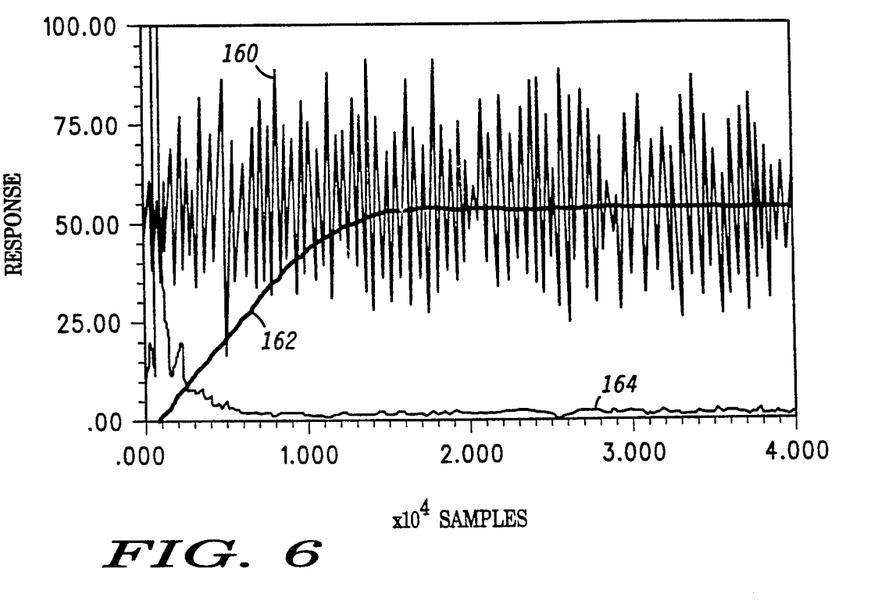
FIG. 6 shows the response of the gain normalization loop of the present invention when presented with a strong noise plus non-noise signal.

FIG. 6 shows a test of gain adjustment loop 50 as a function of time (i.e., as the number of successive data samples increases) for a 17 db signal to noise ratio (SNR) input signal. A large non-noise input signal was used so that the operation of the gain adjustment loop could be more easily observed. Curve 160 shows the noise plus non-noise input signal, curve 162 shows the feedback gain adjustment signal, e.g., signal 48 in FIG. 2, and curve 164 shows the gain of variable gain block 46 being decreased in the presence of this strong signal. This gain reduction forces the input signal power distribution (see FIG. 3) for a noise only input signal power distribution (e.g., curve 80) and/or a noise plus non-noise input signal power distribution (e.g., curve 82) to have the same probability of occurrence at TH1.

Figure 7:
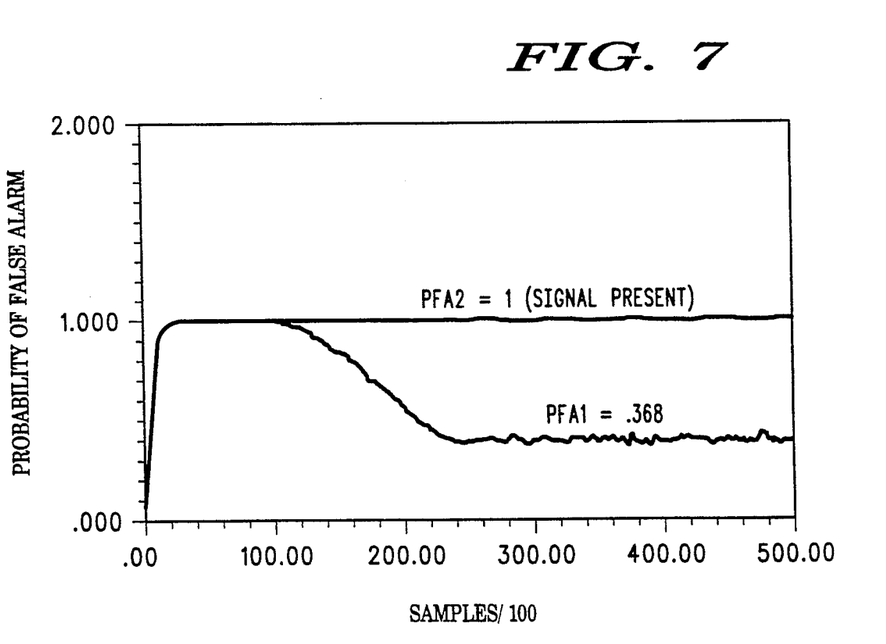
FIG. 7 shows the response of the apparatus of the present invention when presented with a strong noise plus non-noise signal.

FIG. 7 compares PFA1 and PFA2 for this same test condition (17 db SNR input) by plotting the probability of false alarm against time in the form of the number of data samples. PFA1 settles quickly to the predetermined PFA1 value (e.g., 0.368 in this test) while PFA2 remains equal to one, confirming the presence of the strong non-noise component. This shows the system operates properly even when a strong non-noise signal is present.

Figure 8:
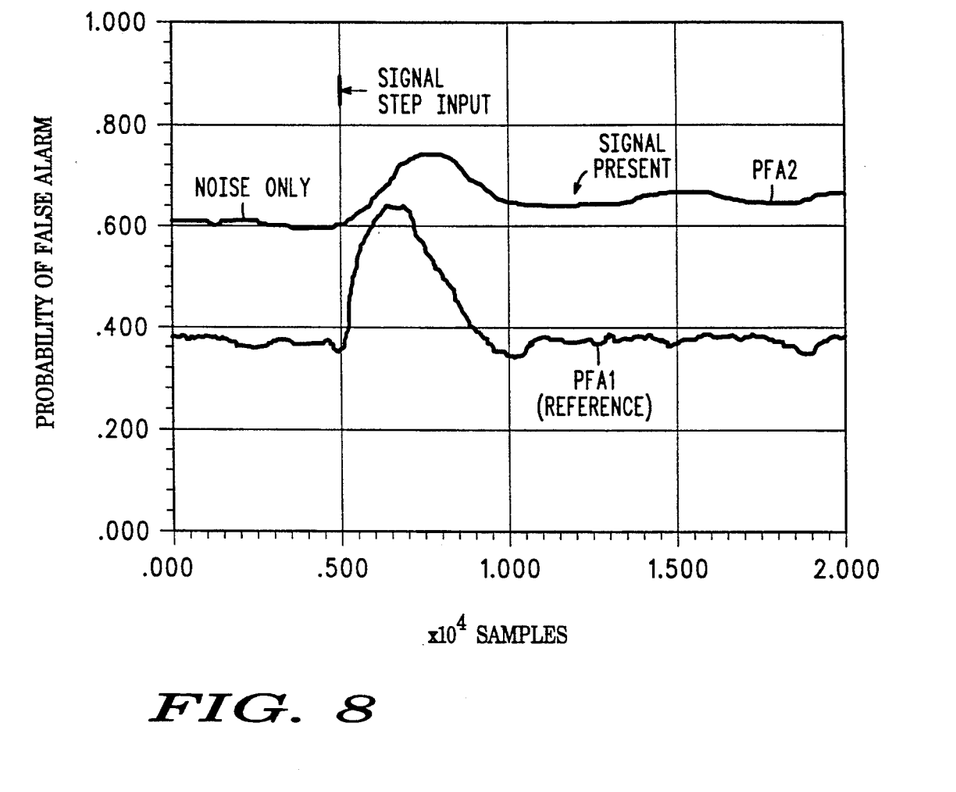
FIG. 8 shows the response of the apparatus of the present invention when presented with a weak non-noise signal.

FIG. 8 shows a plot similar to FIG. 7 but for a step function change (after about 5000 samples) from pure noise to noise plus non-noise with an SNR of 1 db. The PFA1 value determined by normalization loop 50 settles back to the predetermined value of about 0.368 after about 5000 further samples (about 50 millisecs) and, after about the same number of samples, the PFA2 value determined by noise floor circuit 51 rises from the predetermined (noise only) value of about 0.607 to about 0.65 for the noise plus non-noise (SNR=1 db) input. In further tests, PFA2 values of about 0.63–0.65 were obtained at SNR's as low as 0.1 db. These results show that the presence of a non-noise signal can be determined even when heavily masked by noise, and demonstrate the effectiveness of the system in providing improved decisions as to whether non-noise is present so that only those channels with no non-noise signal present are used when updating the noise floor measurement of each channel.

Figure 9:
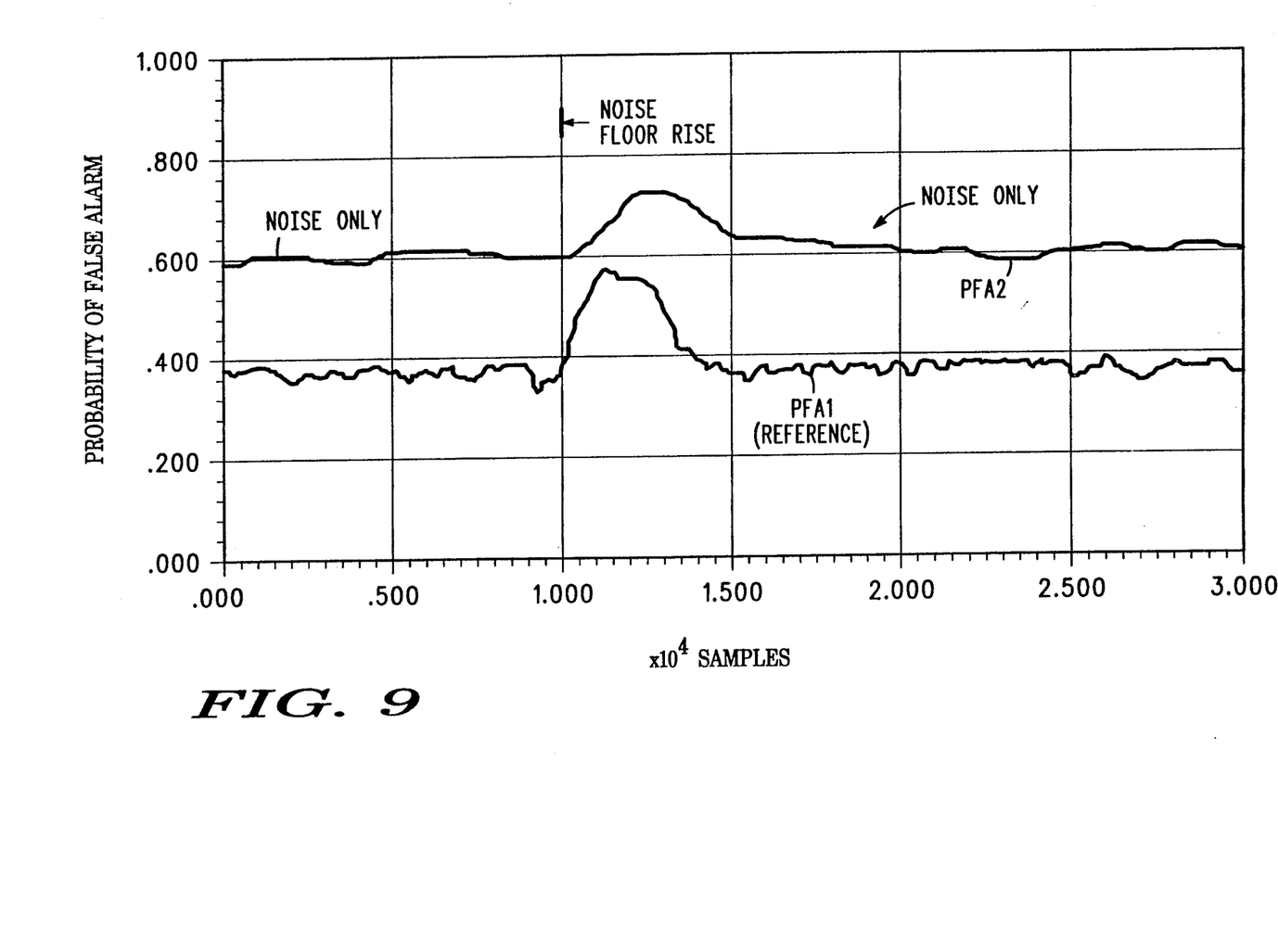
FIG. 9 shows the response of the apparatus of the present invention when presented with a change in input noise energy.

The behavior of the system to a change in the noise power level is shown by FIG. 9 in which the noise input power was increased ("noise floor rise") after about 10,000 samples. While the system undergoes a brief transient lasting about 50 milliseconds, it soon settles back to the noise-only values (e.g., DPFA1~0.368 and DPFA2~0.607), indicating that the invented arrangement is successful in distinguishing between mere changes in the ambient noise level and the presence of even weak (e.g., 0.1 db) non-noise signals. This is an important feature of the present invention.

The above-described arrangement is useful in connection with multichannel receivers having individually established thresholds in different channels for admitting input signals thereto. Such receivers include means 20, 30 for analyzing the input signal and automatically setting the threshold level for that channel, comprising, for example, an adjustment loop 50 for normalizing a first signal proportional to power of the input signal so that a probability P0 that the normalized first signal exceeds a predetermined power level TH1 equals a first predetermined probability P1, a circuit for determining a probability P2 that the normalized first signal exceeds a second predetermined power level TH2, and a circuit 51 for comparing the second probability P2 with a third predetermined probability P3 that a substantially pure noise signal exceeds the second predetermined power level TH2, said comparison indicating whether or not the input signal is substantially noise only. There is further provided a circuit 29 for combining a noise margin with the noise only signal in each channel to obtain a new threshold level in each channel based on the newly determined noise floor for that channel and one or more gates 291 responsive to the channel threshold level for admitting an input signal to that channel receiver 31 when the input signal exceeds the threshold level.

The above-described apparatus operates according to a method comprising, determining a noise floor input signal by (i) normalizing a first signal proportional to power of the input signal so that a probability P0 that the normalized first signal exceeds a predetermined power level TH1 equals a first predetermined probability P1, (ii) determining a probability P2 that the normalized first signal exceeds a second predetermined power level TH2, and (iii) comparing the second probability P2 with a third predetermined probability P3 that a substantially pure noise signal does or does not exceed the second predetermined power level TH2, this comparison indicating whether or not the input signal is a noise floor signal, and thereafter setting a threshold level exceeding the noise floor signal when the comparison indicates that the input signal is a noise floor signal, and thereafter admitting the input signal to the receiver when the input signal exceeds the threshold level.

Based on the foregoing description, it will be apparent to those of skill in the art that the present invention solves the problems and achieves the purposes set forth earlier, and has substantial advantages as pointed out herein, namely, it provides for automatic determination of the presence of corrupting non-noise signals so that the receiver or receiver channel noise-floor may determined with certainty and the receiver input gate threshold reset based thereon without the corrupting influence of significant non-noise signals. The invention provides improved immunity to variations in receiver properties or ambient noise levels with time and/or from channel to channel so that the noise floor and/or receiver threshold sensitivity can be more accurately determined, and further permits each channel of a multichannel receiver to have dynamic, individually determined detection thresholds for each channel without any sacrifice in individual channel sensitivity.

While the present invention has been described in terms of particular elements, circuits, functions and steps, these choices are for convenience of explanation and not intended to be limiting and, as those of skill in the art will understand based on the description herein, the present invention applies to other choices thereof, and it is intended to include in the claims that follow, these and other variations as will occur to those of skill in the art based on the present disclosure.

We claim:

1. An apparatus for receiving an input signal and setting a receiver input threshold level, comprising:
    a first circuit for repetitively testing the input signal to determine when the input signal has a predetermined property characteristic of substantially pure noise, and providing an indication thereof; and
    a second circuit coupled to the first circuit, for setting the receiver input threshold level when said indication is present; and
    wherein the first circuit further comprises a first sub-circuit for deciding when a measured probability that input signal power exceeds a predetermined power level is not larger than a reference probability that a pure noise signal power exceeds the predetermined power level, and providing said indication based thereon.

2. The apparatus of claim 1 wherein the first circuit further comprises a second sub-circuit for adjusting the amplitude of the input signal to have a predetermined probability of exceeding a further preselected power level different than the predetermined power level, said predetermined probability corresponding to the probability that the pure noise signal power exceeds the preselected power level.

3. The apparatus of claim 1 wherein the first circuit further comprises a second sub-circuit for adjusting the amplitude of the input signal to have a predetermined probability of exceeding a further preselected power level larger than the predetermined power level, said predetermined probability corresponding to the probability that the pure noise signal power exceeds the preselected power level.

4. An apparatus for receiving an input signal and setting a receiver input threshold level, comprising:
    a first circuit for repetitively testing the input signal to determine when the input signal has a predetermined property characteristic of substantially pure noise, and providing an indication thereof; and a second circuit coupled to the first circuit, for setting the receiver input threshold level when said indication is present; and wherein the first circuit further comprises, a multiplier for providing a first signal proportional to input signal power, a variable gain circuit coupled to the multiplier and the second circuit for adjusting the amplitude of the first signal so that a probability that the adjusted first signal exceeds a predetermined power level TH1 equals a first predetermined probability P1 that a substantially pure noise signal exceeds the predetermined power level TH1, a circuit for determining a probability P2 that the adjusted first signal exceeds a second predetermined power level TH2, and a circuit for comparing the second probability P2 with a third predetermined probability P3 that the substantially pure noise signal exceeds the second predetermined power level TH2 and providing said indication when the second probability P2 is not larger than the third probability P3.

5. A receiver having one or more channels which has an individually established threshold in each of the one or more channels for admitting input signals thereto, comprising:

a system for analyzing the input signal and automatically setting the threshold level for each of the one or more channels, wherein the system comprises:

an adjustment loop for adjusting the amplitude of a first signal proportional to power of the input signal so that a probability P0 that the adjusted first signal exceeds a predetermined power level TH1 equals a first predetermined probability P1 that a substantially pure noise signal exceeds the predetermined power level TH1;

a circuit for determining a second probability P2 that the adjusted first signal exceeds a second predetermined power level TH2; and a circuit for comparing the second probability P2 with a third predetermined probability P3 that the substantially pure noise signal exceeds the second predetermined power level TH2, said comparison indicating whether or not the input signal is substantially noise only;

a circuit for combining a noise margin with the noise only signal for each of the one or more channels to provide the threshold level in each of the one or more channels; and at least one gate per channel responsive to the threshold level of such channel for admitting an input signal to such channel when the input signal exceeds the threshold level.

6. A method for determining a noise floor of an input signal and setting a receiver input threshold level based thereon, comprising:

receiving the input signal;

repetitively testing the input signal to determine when the input signal has a predetermined property characteristic of substantially pure noise, and providing an indication thereof; and setting the receiver input threshold level when said indication is received; and wherein the determining and providing steps comprise, determining when a measured probability that the input signal power exceeds a further predetermined power level is not larger than a reference probability that a pure noise signal power exceeds the same further predetermined power level, and providing said indication based thereon.

7. The method of claim 6 wherein the determining and providing steps comprise, adjusting the amplitude of the input signal to have a further predetermined probability of exceeding another, different predetermined power level.

8. The method of claim 6 wherein the determining and providing steps comprise, adjusting the amplitude of the input signal to have a further predetermined probability of exceeding a larger predetermined power level.

9. A method for determining a noise floor of an input signal and setting a receiver input threshold level based thereon, comprising:

receiving the input signal;

repetitively testing the input signal to determine when the input signal has a predetermined property characteristic of substantially pure noise, and providing an indication thereof; and setting the receiver input threshold level when said indication is received; and wherein the determining and providing steps comprise, providing a first signal proportional to input signal power, adjusting the amplitude of the first signal so that a probability that the adjusted first signal exceeds a predetermined power level TH1 equals a first predetermined probability P1 corresponding to a substantially pure noise signal, determining a probability P2 that the adjusted signal exceeds a second predetermined power level TH2, and comparing the second probability P2 with a third predetermined probability P3 that a substantially pure noise signal exceeds the second predetermined power level TH2, and providing said indication when the second probability P2 is not larger than the third probability P3.

10. A method for operating an apparatus having presented thereto an input signal which has a noise floor associated therewith, comprising:

determining the presence of a noise floor input signal by (i) adjusting the amplitude of a first signal proportional to power of the input signal so that a probability P0 that the adjusted first signal exceeds a predetermined power level TH1 equals a first predetermined probability P1 that a substantially pure noise signal exceeds the predetermined power level TH1, (ii) determining a probability P2 that the adjusted first signal exceeds a second predetermined power level TH2, and (iii) comparing the second probability P2 with a third predetermined probability P3 that a substantially pure noise signal does or does not exceed the second predetermined power level TH2, said comparison indicating whether or not the input signal is a noise floor signal;

setting a threshold level exceeding the noise floor signal when the comparison indicates that the input signal is a noise floor signal; and admitting the input signal to a signal receiving portion of the apparatus when the input signal exceeds the threshold level.

11. The method of claim 10 wherein a noise floor signal is indicated when P2 is not larger than P3.

12. A method for setting channel threshold levels in a receiver having one or more channels, wherein each channel has noise signals or noise plus non-noise signals, comprising:

determining a signal value proportional to signal power and adjusted to have a predetermined first probability of exceeding a first power value TH1, said first probability being the same as a pure noise signal would have of exceeding the same first power value TH1;

determining a second probability that the adjusted value has a predetermined second probability of exceeding a second power value TH2;

comparing the second probability with a predetermined reference probability that the pure noise signal exceeds the second value TH2;

when the comparing step indicates that the second probability does not exceed the reference probability, setting a threshold signal level for that channel.

13. The method of claim 12 wherein TH2 is less than TH1.

14. A method of operating an apparatus in response to an input comprising a noise component or a noise plus a non-noise component, comprising:

receiving the input;

providing a signal proportional to input power;

adjusting the signal to provide a normalized signal having a known first probability P1 of exceeding a first predetermined power TH1, where P1 corresponds to the probability that a substantially pure noise signal exceeds the first predetermined power TH1;

determining a second probability P2 that the normalized signal exceeds a second predetermined power TH2;

comparing the second probability P2 with a predetermined third probability P3 that the substantially pure noise signal has a power which exceeds the second predetermined power TH2; and providing an indication when the second probability P2 exceeds or does not exceed the third probability P3.

15. The method of claim 14 wherein the determining step, comprises, determining a second probability P2 that the normalized further signal exceeds a second predetermined power TH2 different than the first power TH1.

16. The method of claim 15 wherein the determining step, comprises, determining a second probability P2 that the normalized further signal exceeds a second predetermined power TH2 less than the first power TH1.

17. A method of operating an apparatus in response to an input comprising a noise component plus a non-noise component, comprising:

receiving the input;

providing a signal proportional to input power;

adjusting the signal to provide a normalized signal having a known first probability P1 of exceeding a first predetermined power TH1;

determining a second probability P2 that the normalized signal exceeds a second predetermined power TH2;

comparing the second probability P2 with a predetermined third probability P3 that a pure noise signal has a power which exceeds the second predetermined power TH2;

providing an indication when the second probability P2 exceeds or does not exceed the third probability P3; and wherein the adjusting step comprises passing the signal through a variable gain block to provide an adjusted signal, then determining a fourth probability that the adjusted signal exceeds the first predetermined power TH1, comparing the fourth probability to the predetermined first probability to determine an error amount depending on the difference between the first and fourth probabilities, and feeding back a signal proportional to the error amount to the variable gain block to modify the adjusted signal until the error amount goes substantially to a predetermined reference level, thereby providing the normalized signal.

18. The method of claim 17 wherein the first probability equals the probability that the pure noise signal has a power which exceeds the first predetermined power TH1.

* * * * *